(12) United States Patent
Liu et al.

(10) Patent No.: US 7,911,053 B2
(45) Date of Patent: Mar. 22, 2011

(54) SEMICONDUCTOR PACKAGING WITH INTERNAL WIRING BUS

(75) Inventors: Chenglin Liu, San Jose, CA (US); Shiann-Ming Liou, Campbell, CA (US); Albert Wu, Palo Alto, CA (US)

(73) Assignee: Marvell World Trade Ltd., Hamilton (BM)

( * ) Notice: Subject to any disclaimer, the term of this patent is extended or adjusted under 35 U.S.C. 154(b) by 371 days.

(21) Appl. No.: 12/105,235

(22) Filed: Apr. 17, 2008

(65) Prior Publication Data
US 2008/0258291 A1 Oct. 23, 2008

Related U.S. Application Data

(60) Provisional application No. 60/912,802, filed on Apr. 19, 2007.

(51) Int. Cl.
*H01L 23/34* (2006.01)
(52) U.S. Cl. .................. 257/723; 257/690; 257/E23.06; 438/123
(58) Field of Classification Search .................. None
See application file for complete search history.

(56) References Cited

U.S. PATENT DOCUMENTS

| 5,528,083 | A | 6/1996 | Malladi et al. |
| 5,715,147 | A | 2/1998 | Nagano |
| 5,757,070 | A * | 5/1998 | Fritz ........................... 257/675 |
| 5,789,816 | A | 8/1998 | Wu |
| 6,603,072 | B1 * | 8/2003 | Foster et al. ................... 174/536 |
| 7,208,826 | B2 * | 4/2007 | Sakamoto et al. ............ 257/687 |
| 2003/0162382 | A1 | 8/2003 | Aono et al. |
| 2003/0189258 | A1 | 10/2003 | Uchida |
| 2005/0253278 | A1 | 11/2005 | Lam et al. |
| 2007/0045809 | A1 | 3/2007 | Wheless, Jr. et al. |

FOREIGN PATENT DOCUMENTS

| DE | 196 48 492 A1 | 11/1997 |
| EP | 1 160 866 A1 | 12/2001 |
| WO | WO 2004090977 A | 10/2004 |

* cited by examiner

*Primary Examiner* — Jarrett J Stark

(57) ABSTRACT

A packaged semiconductor includes inner bond fingers, at least first and second semiconductor dies, and an interposer. The packaged semiconductor further includes wiring between the first and second semiconductor dies and the inner bond fingers, wiring between the interposer and the inner bond fingers, and wiring between the interposer and the first and second semiconductor dies. The wiring between the interposer and the first and second semiconductor dies thereby reduces the count of inner bond fingers needed for the wiring between the first and second semiconductor dies and the inner bond fingers. The interposer further provides indirect access to the inner bond fingers when the inner bond fingers are inaccessible by the first and second semiconductor dies.

15 Claims, 7 Drawing Sheets

SEMICONDUCTOR PACKAGING WITH INTERNAL WIRING BUS

CROSS-REFERENCE TO RELATED APPLICATION

This application claims the benefit of U.S. Provisional Patent Application No. 60/912,802, filed Apr. 19, 2007, the contents of which are hereby incorporated by reference as if fully stated herein.

FIELD

The present disclosure relates to a packaged semiconductor.

BACKGROUND

To increase the functionality of packaged semiconductors, it is preferable to provide multiple semiconductor dies, each with different functionalities, in the same package. The different semiconductor dies are combined and connected together using gold wiring. Power is then provided to the semiconductor dies through external package pins. The external package pins are connected to inner bond fingers which are usually wire bonded to each of the semiconductor dies. However, it is sometimes difficult to provide power to each of the semiconductor dies. For example, access to the inner bond fingers is limited due to physical limitations or interconnection process limitations, or there might not be any extra inner bond fingers available.

SUMMARY

The foregoing situation is addressed by including an interposer which provides the semiconductor dies with indirect access to inner bond fingers.

Thus, in one aspect, a packaged semiconductor includes inner bond fingers, at least first and second semiconductor dies, and an interposer. The packaged semiconductor further includes wiring between the first and second semiconductor dies and the inner bond fingers, wiring between the interposer and the inner bond fingers, and wiring between the interposer and the first and second semiconductor dies. The wiring between the interposer and the first and second semiconductor dies thereby reduces the count of inner bond fingers needed for the wiring between the first and second semiconductor dies and the inner bond fingers.

Since the interposer is internal and acts as a bridge between the first and second semiconductor dies and the inner bond fingers, the interposer further provides indirect access to the inner bond fingers when the inner bond fingers are inaccessible by the first and second semiconductor dies.

In one example embodiment, the interposer may be positioned between the first and second semiconductor dies. The inner bond fingers provide power, an electrical ground, and electrical signals to the first and second semiconductor dies through the wiring connection between the inner bond fingers and the first and second semiconductor dies. The inner bond fingers also provide power, an electrical ground, and electrical signals to the interposer through the wiring connection between the interposer and the inner bond fingers. The interposer, in turn, provides power, an electrical ground, and electrical signals to the first and second semiconductor dies, when the inner bond fingers are inaccessible by the first and second semiconductor dies, through the wiring connection between the interposer and the first and second semiconductor dies. Thus, the first and second semiconductor dies have full access to power, an electrical ground, and electrical signals.

A more complete understanding can be obtained by reference to the following detailed description and to the attached drawings.

DETAILED DESCRIPTION

Figure 1:
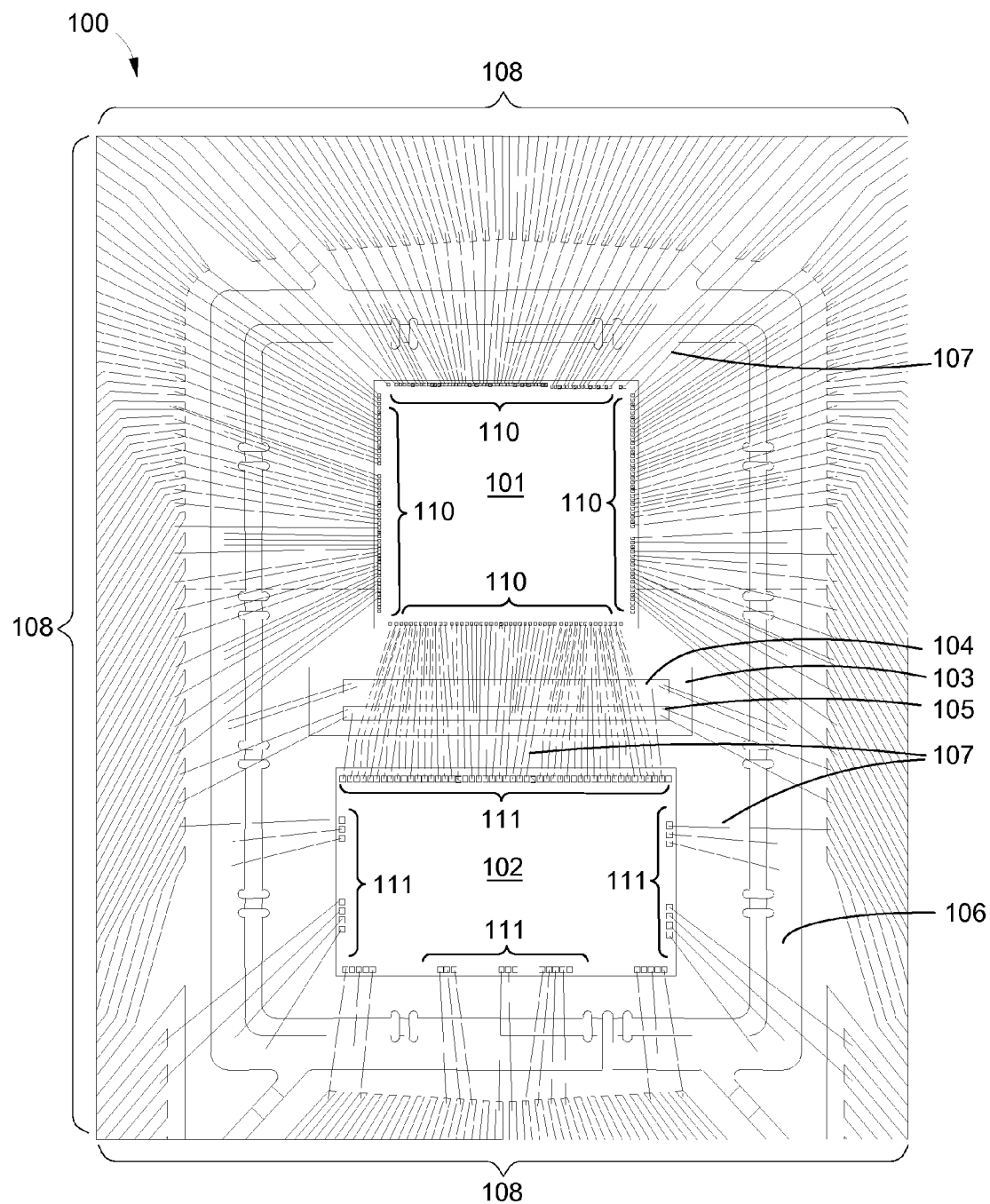
FIG. 1 is a top view of a semiconductor package according to a first example embodiment of the invention.

FIG. 1 shows a top view of a semiconductor package 100 according to a first example embodiment of the invention. As shown in FIG. 1, the semiconductor package 100 includes semiconductor dies 101 and 102, an interposer 103, an electrical ground 106, wiring 107, and inner bond fingers 108. The interposer 103 is shown to include a ground connection 104 and a power connection 105. Semiconductor dies 101 and 102 are shown to include connectors 110 and 111, respectively.

FIG. 1 further shows semiconductor dies 101 and 102 connected, via connectors 110 and 111, to inner bond fingers 108, which are also called bonding fingers. The connection between semiconductor dies 101 and 102 and inner bond fingers 108 is made with wiring 107 using a wire bonding method. The wiring 107 can be, for example, gold, aluminum, or copper wiring and the wire bonding method can include either ball bonding or wedge bonding. The connection of semiconductor dies 101 and 102 to inner bond fingers 108 provides semiconductor dies 101 and 102 with power, ground, and/or signals. Furthermore, semiconductor dies 101 and 102 are also connected to the electrical ground 106 with wiring 107 using a wire bonding method. The electrical ground 106 is ring-shaped and surrounds semiconductor dies 101 and 102 to provide an additional source for ample grounding connections.

As shown in FIG. 1, semiconductor dies 101 and 102 are positioned side-by-side, so that semiconductor die 101 and semiconductor die 102 can be interconnected with wiring 107 using a wire bonding method. However, neither of semiconductor dies 101 and 102 have access to inner bond fingers 108 nor the electrical ground 106 on the side of each of semiconductor dies 101 and 102 that faces the opposing semiconductor die, because each of semiconductor dies 101 and 102 physically blocks the opposing semiconductor die from accessing the inner bond fingers 108 or the electrical ground 106. Since connectors 110 and 111 on one side of both semiconductor dies 101 and 102, respectively, are blocked from accessing both inner bond fingers 108 and the electrical ground 106, semiconductor dies 101 and 102 do not have full access to power, ground, and/or signals. Furthermore, because both semiconductor dies 101 and 102 may need access to inner bond fingers 108 on all sides of each semiconductor dies 101 and 102, there are not enough inner bond fingers 108 to connect to each semiconductor die. Thus, the interposer 103 is included in the semiconductor package 100 to provide semiconductor dies 101 and 102 indirect access to inner bond fingers 108 and also to reduce the number of inner bond fingers 108 necessary for providing power.

As shown in FIG. 1, the interposer 103 is positioned between semiconductor dies 101 and 102. Semiconductor dies 101 and 102 are connected to the power connection 105 and the electrical ground connection 104 of the interposer 103 with wiring 107 using a wire bonding method. The power connection 105 is connected to inner bond fingers 108 with wiring 107 and the electrical ground connection 104 is connected to the electrical ground 106 with wiring 107, both using a wire bonding method. Thus, the interposer 103 acts as a bridge for providing the semiconductor dies 101 and 102 power, an electrical ground, and/or signals, when the inner bond fingers 108 and the electrical ground 106 are inaccessible.

Since semiconductor dies 101 and 102 have full access to power, ground, and/or signals through the interposer 103, and the semiconductor dies 101 and 102 are interconnected, a packaged semiconductor is formed having different functionalities. The packaged semiconductor can be used by any electronic device, such as, for example, a mobile phone, personal computer, or digital music player. Other embodiments are described below in connection with FIGS. 5A through 5H.

Semiconductor dies 101 and 102 can be formed from different wafer processing, or semiconductor dies 101 and 102 can be formed from the same wafer processing but perform different functionalities within the semiconductor package 100. For example, semiconductor dies 101 and 102 could be an application-specific integrated circuit (ASIC), flash memory, or a double data rate synchronous dynamic random access memory (DDR SDRAM). However, the semiconductor package 100 is not limited to include only these specific types of semiconductor dies; rather, the semiconductor package 100 may include other forms of semiconductor dies as required. In this embodiment, there are two semiconductor dies shown; however, in other embodiments the semiconductor package can include more than two semiconductor dies, as required to obtain a desired amount of multiple functionality for the semiconductor package.

In other embodiments, if more semiconductor dies are included, additional interposers can also be included as needed to provide access to power, ground, and/or signals to each semiconductor die. The interposer 103 can also have basic electrical functions, such as capacitance and inductance. Additionally, the interposer 103 can be a ball grid array (BGA) substrate material such as bismaleimide triazine (BT) with Cu traces/planes or Silicon dice with simple metallization.

Figure 2:
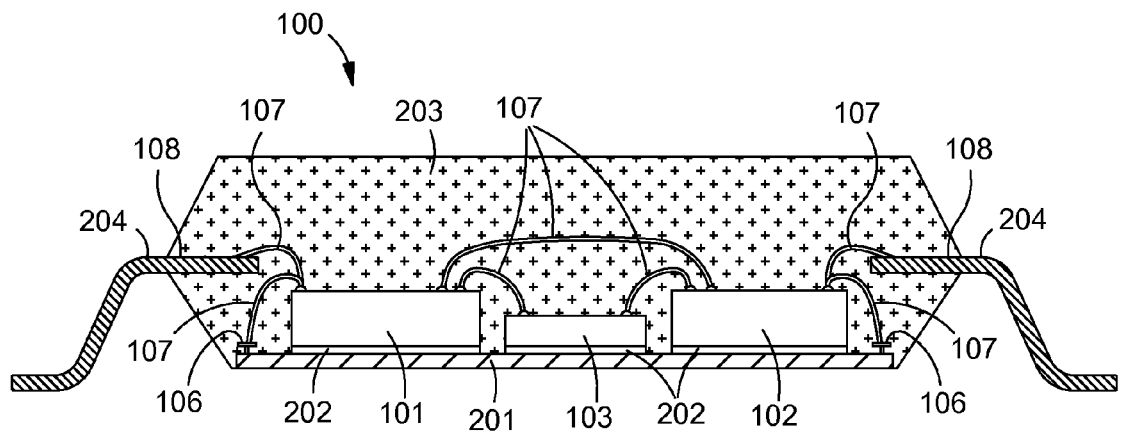
FIG. 2 is a cross-sectional view of a semiconductor package according to the first example embodiment of the invention.

FIG. 2 will now be discussed to further illustrate the internal structure of the first example embodiment of the invention. FIG. 2 shows a cross-sectional view of a semiconductor package according to the first example embodiment of the invention. As shown in FIG. 2, semiconductor package 100 further includes a die pad 201, die attach material 202, mold compound 203, and external package pins 204.

As shown in FIG. 2, semiconductor dies 101 and 102 are connected to inner bond fingers 108, connected to each other, and connected to the interposer 103 with wiring 107 through a wire bonding method. The inner bond fingers 108 are connected to external package pins 204 and receive power, electrical grounding, and/or signals from the external package pins 204. As described above, the interposer 103 provides the semiconductor dies 101 and 102 power, an electrical ground, and/or signals, when the inner bond fingers 108 and the electrical ground 106 are inaccessible. Furthermore, semiconductor dies 101 and 102 are mounted to the die pad 201 using the die attach material 202. The die pad 201 can either be exposed on the bottom surface of the semiconductor package 100 as shown in FIG. 2, or the die pad 201 can be exposed inside the mold compound 203. The die pad 201 is exposed for thermal regulation. Moreover, the electrical ground 106 is raised above the die pad 201 to provide easier access for wire bonding.

Figure 3:
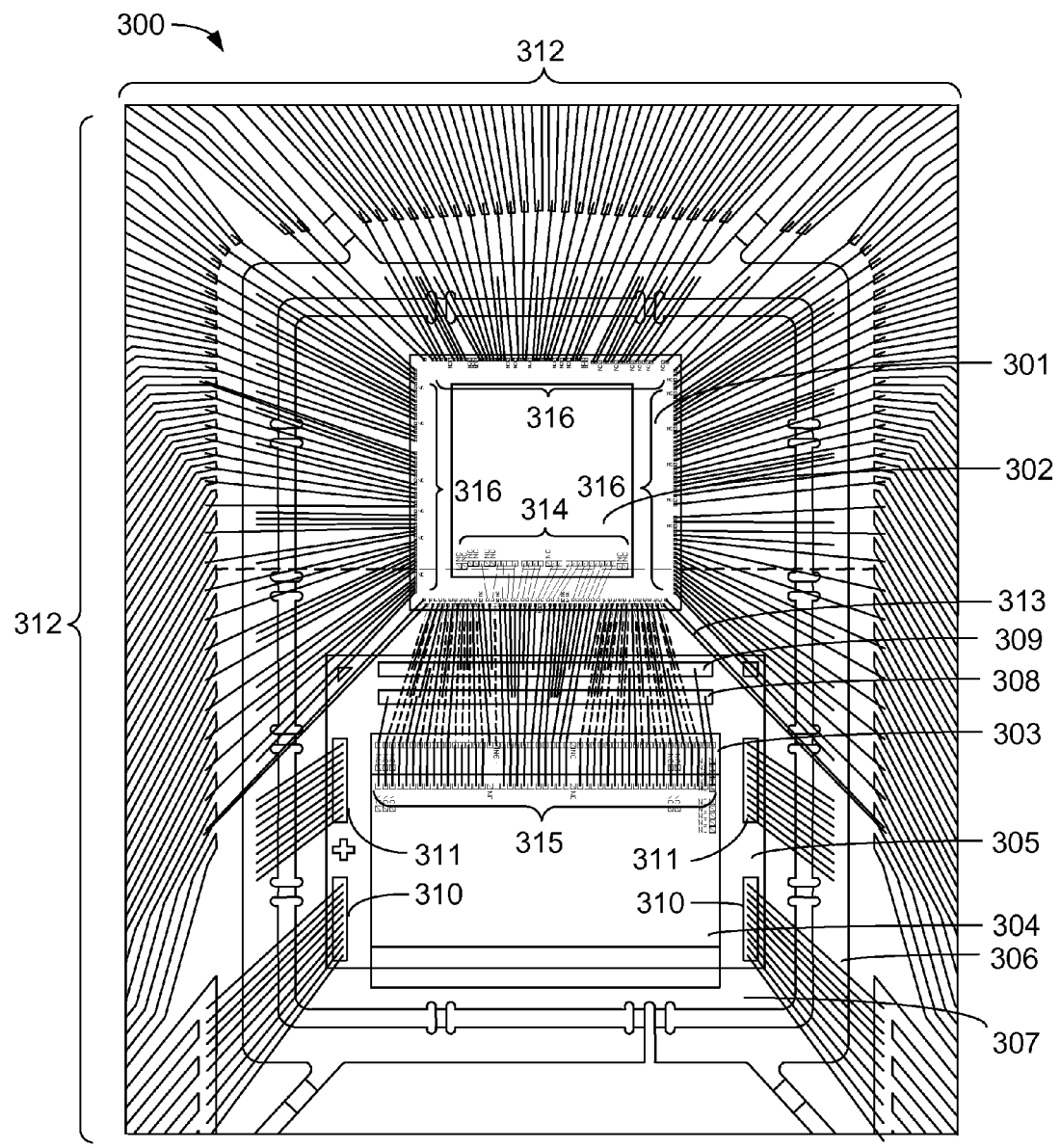
FIG. 3 is a top view of a semiconductor package according to a second example embodiment of the invention.

FIG. 3 will now be discussed to illustrate a second and more complex example embodiment of the invention. FIG. 3 shows a top view of a semiconductor package 300 according to this second example embodiment of the invention. As seen in FIG. 3, the semiconductor package 300 includes semiconductor dies 301, 302, 303, and 304, an interposer 305, an electrical ground 306, a die pad 307, inner bond fingers 312, and wiring 313. The interposer 305 includes power connections 308 and 310 and ground connections 309 and 311. Semiconductor die 301 includes connectors 316, semiconductor die 302 includes connectors 314, and semiconductor dies 303 and 304 include connectors 315.

Semiconductor dies 301, 302, 303, and 304 can be formed from different wafer processing, or can be formed from the same wafer processing but perform different functionalities within the semiconductor package 300. For example, in FIG. 3, semiconductor die 301 could be an ASIC, semiconductor die 302 could be a flash memory, and semiconductor dies 303 and 304 could both be DDR SDRAM. However, the semiconductor package 300 is not limited to include only these specific types of semiconductor dies; rather, the semiconductor package 300 may include other forms of semiconductor dies as required. In this embodiment, there are four semiconductor dies shown; however, in other embodiments the semiconductor package can include two semiconductor dies or more, as needed to provide the multiple functionalities as intended for the semiconductor package.

As shown in FIG. 3, semiconductor die 301 is connected via connectors 316 to inner bond fingers 312 and the electrical ground 306 by wire bonding using wiring 313. The inner bond fingers 312 provide power, ground, and/or signals and the electrical ground 306 provides an additional source for an electrical ground. The electrical ground 306 is ring-shaped and surrounds semiconductor dies 301, 302, 303, and 304 so as to provide ample grounding connections. However, none of semiconductor dies 301, 302, 303, and 304 have access to inner bond fingers 312 nor the electrical ground 306 on the side of each of semiconductor dies 301 to 304 that face the opposing semiconductor dies, because each of semiconductor dies 301 to 304 physically blocks the opposing semiconductor dies from accessing the inner bond fingers 312 and the electrical ground 306. Since connectors 314 of semiconductor die 302, connectors 315 of semiconductor dies 303 and 304, and connectors 316 of semiconductor die 301 are blocked from accessing both inner bond fingers 312 and the electrical ground 306 on one side of each of the semiconductor dies 301 to 304, semiconductor dies 301 to 304 do not have full access to power, ground, and/or signals. In order for semiconductor dies 301 to 304 to have full access to power and an electrical ground, the interposer 305 acts as a bridge and is implemented as described below.

In this embodiment, the interposer 305 connects to the inner bond fingers 312 through a wire bonding connection between the power connections 310 and the inner bond fingers 312. The interposer 305 also connects to the electrical ground 306 through a wire bonding connection between the ground connections 311 and the electrical ground 306. The power connections 310 and the ground connections 311 are routed inside the interposer 305 to a power connection 308 and a ground connection 309, respectively. As illustrated, the power connection 308 and the ground connection 309 are disposed between respective inner, opposing edges of the semiconductor die 301 and the semiconductor die 303. The power connections 310 and the ground connections 311 are disposed along edges of the interposer 305 that are substantially perpendicular to the inner, opposing edges of the semiconductor die 301 and the semiconductor die 303, as shown. Semiconductor dies 301 and 303 are connected, or directly coupled, via connectors 316 and 315, respectively, to the interposer 305 through a wire bonding connection to power connection 308 and ground connection 309. Moreover, semiconductor die 302 is connected to semiconductor die 301 by wire bonding connectors 314 and 316 and semiconductor die 304 is connected to semiconductor die 303 by wire bonding connectors 315. Thus, through the interposer 305, semiconductor dies 301 to 304 have full access to power, as provided by the inner bond fingers 312, and full access to an electrical ground, as provided by the electrical ground 306.

Semiconductor die 301 is also connected to semiconductor die 303 by wire bonding so that all of semiconductor dies 301 to 304 are interconnected. The interposer 305 can also provide semiconductor dies 301 to 304 indirect access to electrical signals as provided by the inner bond fingers 312. The above-described connections provide a fully integrated packaged semiconductor, in which each semiconductor die is provided power, an electrical ground, and/or signals.

The embodiment as shown in FIG. 3 only includes one interposer 305. However, additional interposers can be included as needed to provide access to power and ground for each semiconductor die. The interposer 305 can also have basic electrical functions, such as capacitance and inductance. Additionally, the interposer 305 can be a BGA substrate material such as BT with Cu traces/planes or Silicon die with simple metallization.

Figure 4:
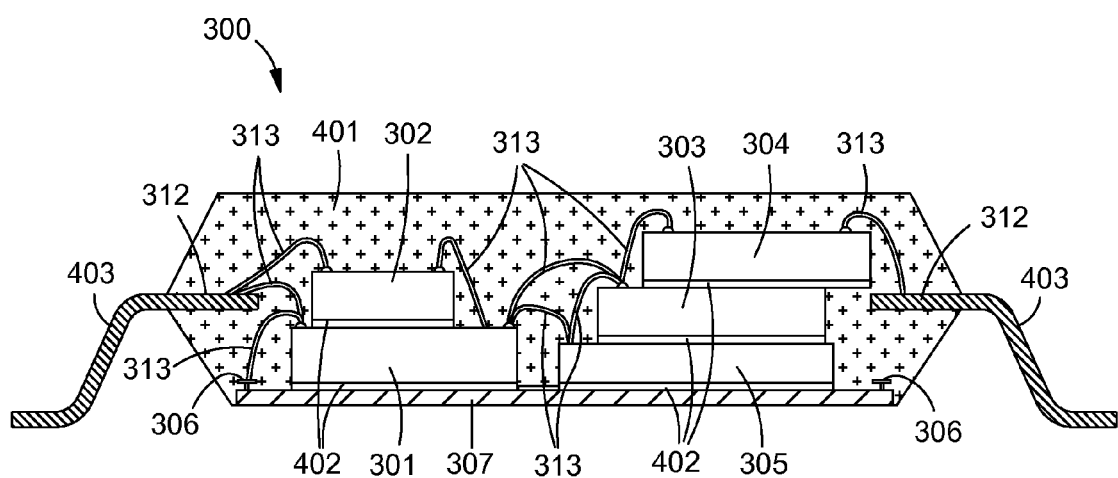
FIG. 4 is a cross-sectional view of a semiconductor package according to the second example embodiment of the invention.

FIG. 4 will now be discussed to more clearly illustrate the internal structure and interconnections of the second example embodiment of the invention. FIG. 4 shows a simplified cross-sectional view of semiconductor package 300 according to the second example embodiment of the invention.

As shown in FIG. 4, the semiconductor package includes semiconductor dies 301, 302, 303, and 304, an interposer 305, a die pad 307, inner bond fingers 312, wiring 313, a mold compound 401, a die attach material 402, and external package pins 403. In this embodiment, semiconductor die 302 is stacked on top of semiconductor die 301, semiconductor die 303 is stacked on top of the interposer 305, and semiconductor die 304 is stacked on top of semiconductor die 303. However, in other embodiments, the semiconductor dies can be positioned side-by-side and additional semiconductor dies can be stacked on top of each other as needed.

Semiconductor dies 301, 302, 303 and 304 are wire bonded to the inner bond fingers 312 using wiring 313. The inner bond fingers 312 are connected to external package pins 403 and receive power, electrical grounding, and/or signals from the external package pins 403. Semiconductor die 302 is wire bonded to semiconductor die 301 using wiring 313. Alternatively, semiconductor die 302 can be connected to semiconductor die 301 through the process of flip chip, which is also called Controlled Collapse Chip Connection (C4). Furthermore, semiconductor die 303 is interconnected by wire bonding with semiconductor die 301 using wiring 313. Also, both semiconductors 301 and 303 are wire bonded to the interposer 305 using wiring 313. As described above, the interposer 305 provides the semiconductor dies 301 and 303 power, an electrical ground, and/or signals, when the inner bond fingers 312 are inaccessible. Moreover, semiconductor die 304 is wire bonded to semiconductor die 303 using wiring 313. Alternatively, semiconductor die 304 can be connected to semiconductor die 303 through the process of flip chip. The interconnections between the semiconductor dies 301 to 304 and the connections to the inner bond fingers 312 provide a packaged semiconductor with multiple functionalities. In other embodiments, wire bonding can also be between the semiconductor package inner leads, E-pads, and bonding rings.

In this embodiment, the interposer 305 and semiconductor die 301 are mounted to the die pad 307 using the die attach material 402. The die pad 307 can either be exposed on the bottom surface of the semiconductor package or be exposed inside the mold compound 401 to provide thermal regulation for the semiconductor dies. Moreover, the electrical ground 306 is raised above the die pad 307 to provide easier access for wire bonding.

Generally, in all embodiments, the semiconductor package can be either a leadframe based package, such as, for example, a low-profile quad flat pack (LQFP), thin quad flat pack (TQFP), quad flat package no leads (QFN), or thin small-outline package (TSOP) or a substrate based package, such as, for example plastic ball grid array (PBGA), thin and fine-pitch ball grid array (TFBGA), or land grid array (LGA).

Figure 5A:
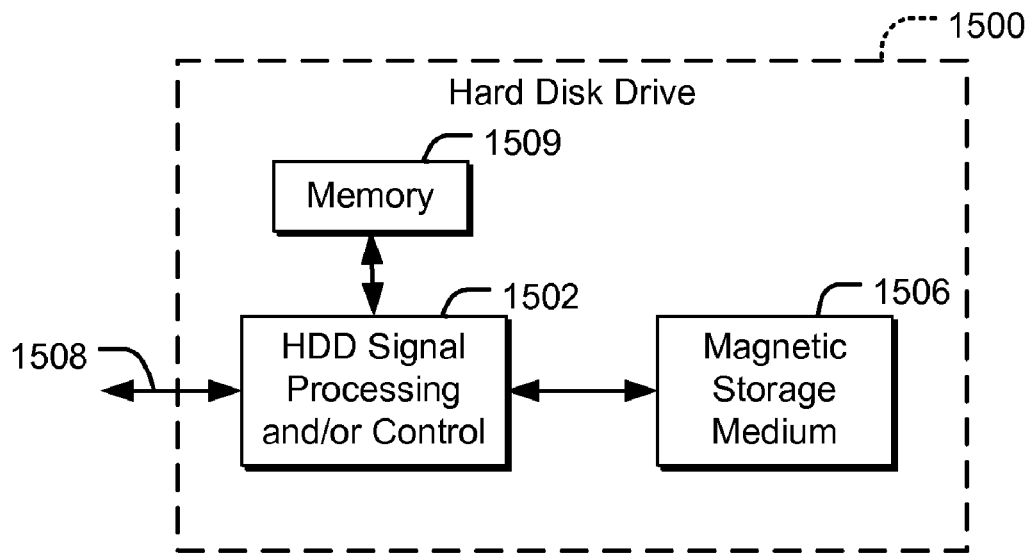
FIG. 5A is a block diagram showing an embodiment of the invention in a hard disk drive (HDD).

Referring now to FIGS. 5A-5H, various exemplary implementations of the present invention are shown. Referring to FIG. 5A, the present invention may be embodied as a packaged semiconductor in a hard disk drive (HDD) 1500. The present invention may implement either or both signal processing and/or control circuits, which are generally identified in FIG. 5A at 1502. In some implementations, signal processing and/or control circuit 1502 and/or other circuits (not shown) in HDD 1500 may process data, perform coding and/or encryption, perform calculations, and/or format data that is output to and/or received from a magnetic storage medium 1506.

HDD 1500 may communicate with a host device (not shown) such as a computer, mobile computing devices such as personal digital assistants, cellular phones, media or MP3 players and the like, and/or other devices via one or more wired or wireless communication links 1508. HDD 1500 may be connected to memory 1509, such as random access memory (RAM), a low latency nonvolatile memory such as flash memory, read only memory (ROM) and/or other suitable electronic data storage.

Figure 5B:
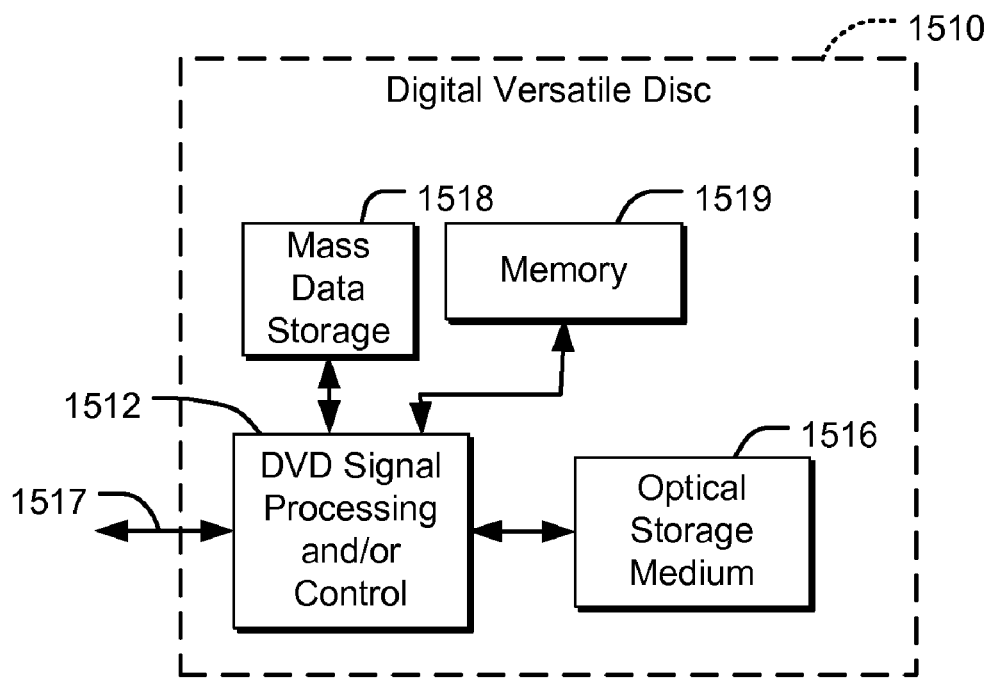
FIG. 5B is a block diagram of an embodiment of the invention in a digital versatile disc (DVD) drive.

Referring now to FIG. 5B, the present invention may be embodied as a packaged semiconductor in a digital versatile disc (DVD) drive 1510. The present invention may implement either or both signal processing and/or control circuits, which are generally identified in FIG. 5B at 1512, and/or mass data storage 1518 of DVD drive 1510. Signal processing and/or control circuit 1512 and/or other circuits (not shown) in DVD drive 1510 may process data, perform coding and/or encryption, perform calculations, and/or format data that is read from and/or data written to an optical storage medium 1516. In some implementations, signal processing and/or control circuit 1512 and/or other circuits (not shown) in DVD drive 1510 can also perform other functions such as encoding and/or decoding and/or any other signal processing functions associated with a DVD drive.

DVD drive 1510 may communicate with an output device (not shown) such as a computer, television or other device via one or more wired or wireless communication links 1517. DVD drive 1510 may communicate with mass data storage 1518 that stores data in a nonvolatile manner. Mass data storage 1518 may include a hard disk drive (HDD) such as that shown in FIG. 5A. The HDD may be a mini HDD that includes one or more platters having a diameter that is smaller than approximately 1.8". DVD drive 1510 may be connected to memory 1519, such as RAM, ROM, low latency nonvolatile memory such as flash memory, and/or other suitable electronic data storage.

Figure 5C:
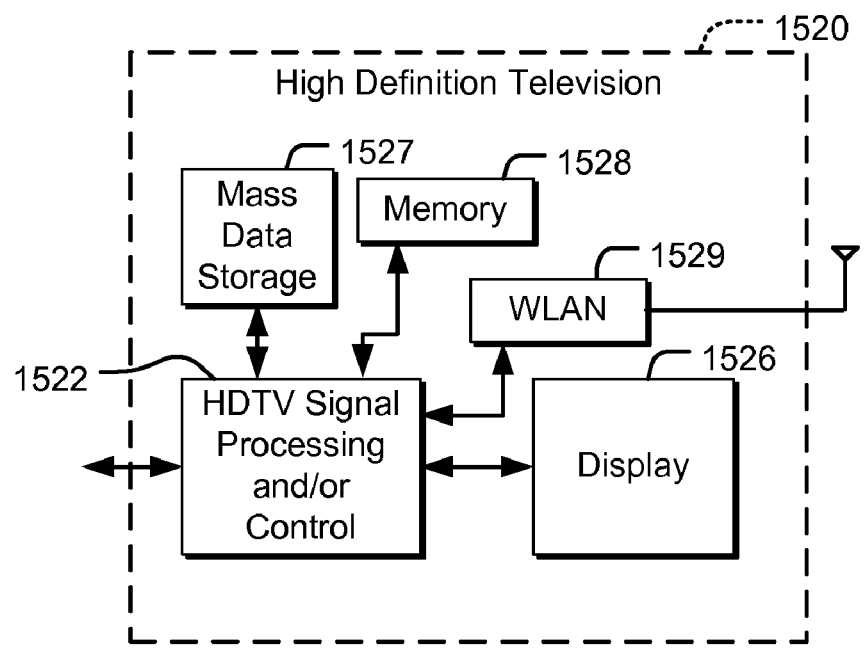
FIG. 5C is a block diagram of an embodiment of the invention in a high definition television (HDTV).

Referring now to FIG. 5C, the present invention may be embodied as a packaged semiconductor in a high definition television (HDTV) 1520. The present invention may implement either or both signal processing and/or control circuits, which are generally identified in FIG. 5C at 1522, a WLAN interface and/or mass data storage of the HDTV 1520. HDTV 1520 receives HDTV input signals in either a wired or wireless format and generates HDTV output signals for a display 1526. In some implementations, signal processing circuit and/or control circuit 1522 and/or other circuits (not shown) of HDTV 1520 may process data, perform coding and/or encryption, perform calculations, format data and/or perform any other type of HDTV processing that may be required.

HDTV 1520 may communicate with mass data storage 1527 that stores data in a nonvolatile manner such as optical and/or magnetic storage devices, for example, hard disk drives and/or DVD drives. At least one HDD may have the configuration shown in FIG. 5A and/or at least one DVD drive may have the configuration shown in FIG. 5B. The HDD may be a mini HDD that includes one or more platters having a diameter that is smaller than approximately 1.8". HDTV 1520 may be connected to memory 1528 such as RAM, ROM, low latency nonvolatile memory such as flash memory and/or other suitable electronic data storage. HDTV 1520 also may support connections with a WLAN via a WLAN interface 1529.

Figure 5D:
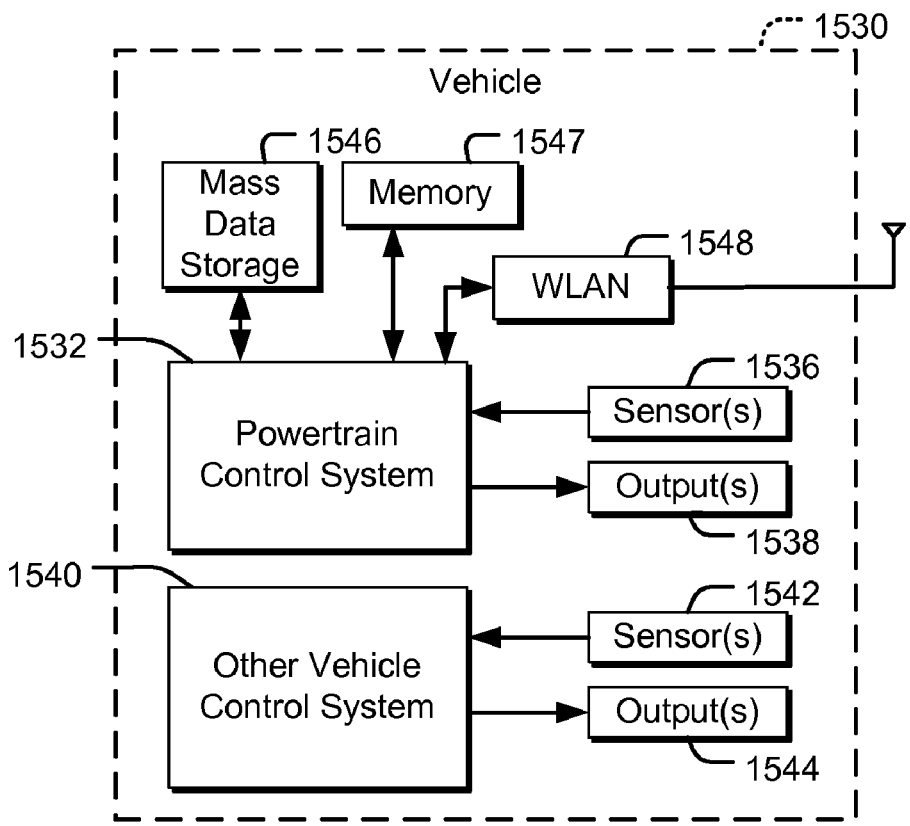
FIG. 5D is a block diagram of an embodiment of the invention in a vehicle.

Referring now to FIG. 5D, the present invention may be embodied as a packaged semiconductor in a control system of a vehicle 1530, a WLAN interface and/or mass data storage of the vehicle control system. In some implementations, the present invention implements a powertrain control system 1532 that receives inputs from one or more sensors 1536 such as temperature sensors, pressure sensors, rotational sensors, airflow sensors and/or any other suitable sensors and/or that generates one or more output control signals 1538 such as engine operating parameters, transmission operating parameters, braking parameters, and/or other control signals.

The present invention may also be embodied in other control systems 1540 of vehicle 1530. Control system 1540 may likewise receive signals from input sensors 1542 and/or output control signals to one or more output devices 1544. In some implementations, control system 1540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1532 may communicate with mass data storage 1546 that stores data in a nonvolatile manner. Mass data storage 1546 may include optical and/or magnetic storage devices, for example, hard disk drives and/or DVD drives. At least one HDD may have the configuration shown in FIG. 5A and/or at least one DVD drive may have the configuration shown in FIG. 5B. The HDD may be a mini HDD that includes one or more platters having a diameter that is smaller than approximately 1.8". Powertrain control system 1532 may be connected to memory 1547 such as RAM, ROM, low latency nonvolatile memory such as flash memory and/or other suitable electronic data storage. Powertrain control system 1532 also may support connections with a WLAN via a WLAN interface 1548. The control system 1540 may also include mass data storage, memory and/or a WLAN interface (all not shown).

Figure 5E:
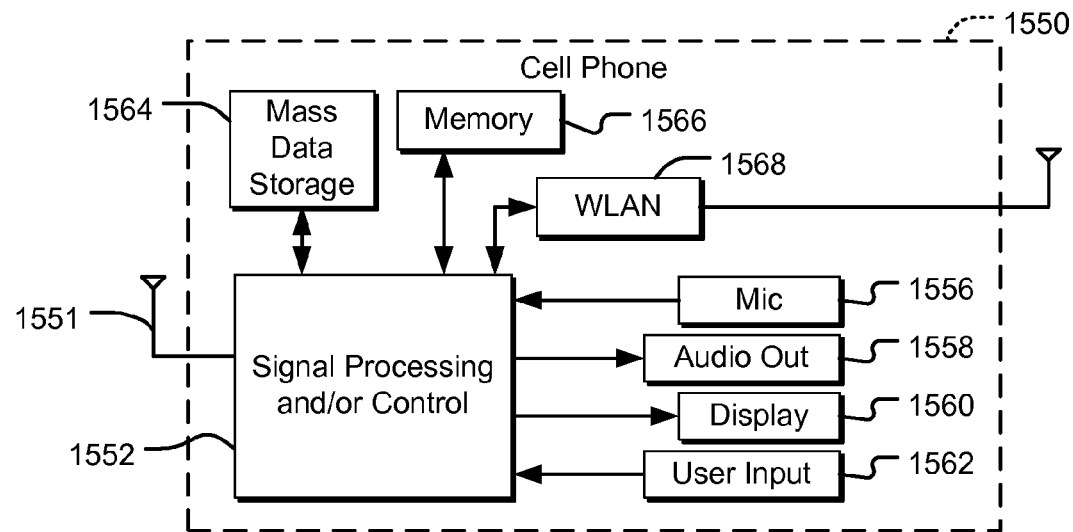
FIG. 5E is a block diagram of an embodiment of the invention in a cellular or mobile phone.

Referring now to FIG. 5E, the present invention may be embodied as a packaged semiconductor in a cellular phone 1550 that may include a cellular antenna 1551. The present invention may implement either or both signal processing and/or control circuits, which are generally identified in FIG. 5E at 1552, a WLAN interface and/or mass data storage of the cellular phone 1550. In some implementations, cellular phone 1550 includes a microphone 1556, an audio output 1558 such as a speaker and/or audio output jack, a display 1560 and/or an input device 1562 such as a keypad, pointing device, voice actuation and/or other input device. Signal processing and/or control circuits 1552 and/or other circuits (not shown) in cellular phone 1550 may process data, perform coding and/or encryption, perform calculations, format data and/or perform other cellular phone functions.

Cellular phone 1550 may communicate with mass data storage 1564 that stores data in a nonvolatile manner such as optical and/or magnetic storage devices, for example, hard disk drives and/or DVD drives. At least one HDD may have the configuration shown in FIG. 5A and/or at least one DVD drive may have the configuration shown in FIG. 5B. The HDD may be a mini HDD that includes one or more platters having a diameter that is smaller than approximately 1.8". Cellular phone 1550 may be connected to memory 1566 such as RAM, ROM, low latency nonvolatile memory such as flash memory and/or other suitable electronic data storage. Cellular phone 1550 also may support connections with a WLAN via a WLAN interface 1568.

Figure 5F:
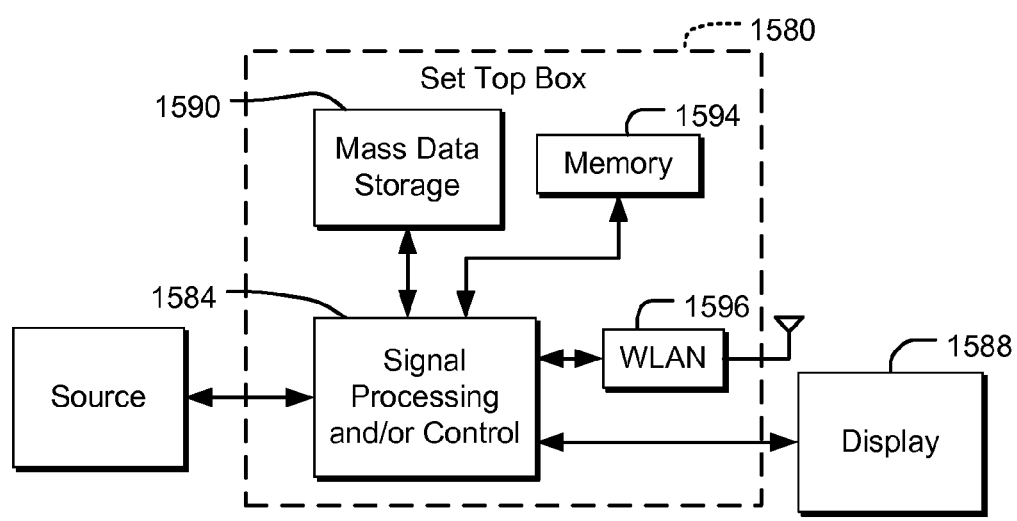
FIG. 5F is a block diagram of an embodiment of the invention in a set-top box.

Referring now to FIG. 5F, the present invention may be embodied as a packaged semiconductor in a set top box 1580. The present invention may implement either or both signal processing and/or control circuits, which are generally identified in FIG. 5F at 1584, a WLAN interface and/or mass data storage of the set top box 1580. Set top box 1580 receives signals from a source such as a broadband source and outputs standard and/or high definition audio/video signals suitable for a display 1588 such as a television and/or monitor and/or other video and/or audio output devices. Signal processing and/or control circuits 1584 and/or other circuits (not shown) of the set top box 1580 may process data, perform coding and/or encryption, perform calculations, format data and/or perform any other set top box function.

Set top box 1580 may communicate with mass data storage 1590 that stores data in a nonvolatile manner. Mass data storage 1590 may include optical and/or magnetic storage devices, for example, hard disk drives and/or DVD drives. At least one HDD may have the configuration shown in FIG. 5A and/or at least one DVD drive may have the configuration shown in FIG. 5B. The HDD may be a mini HDD that includes one or more platters having a diameter that is smaller than approximately 1.8". Set top box 1580 may be connected to memory 1594 such as RAM, ROM, low latency nonvolatile memory such as flash memory and/or other suitable electronic data storage. Set top box 1580 also may support connections with a WLAN via a WLAN interface 1596.

Figure 5G:
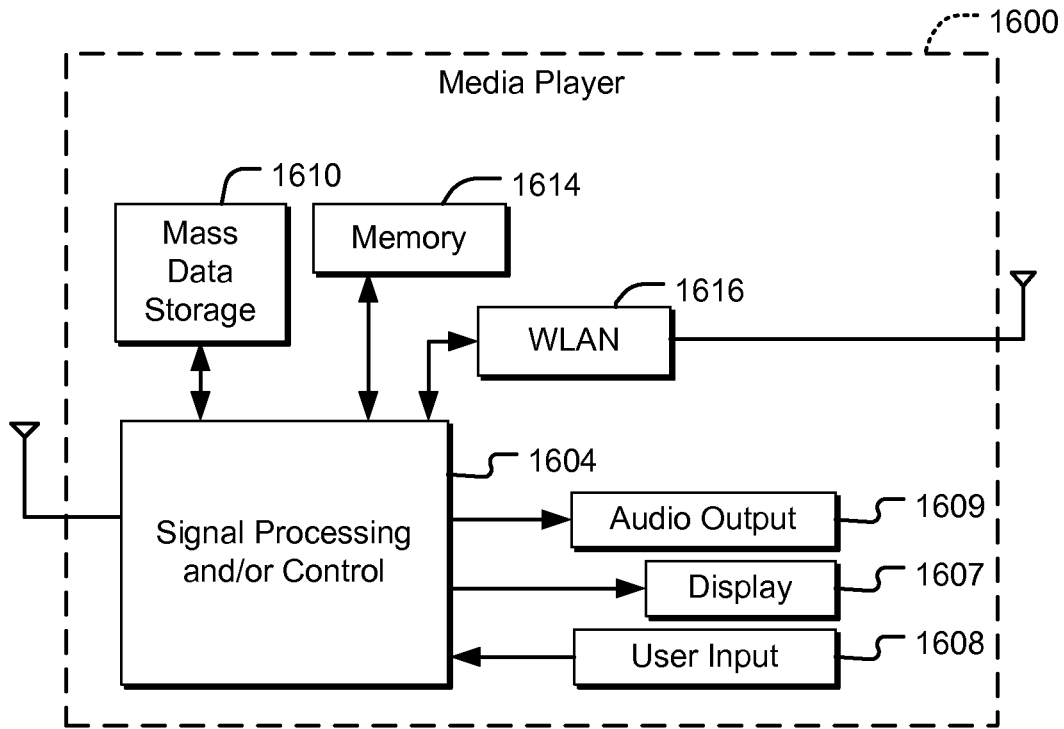
FIG. 5G is a block diagram of an embodiment of the invention in a media player.

Referring now to FIG. 5G, the present invention may be embodied as a packaged semiconductor in a media player 1600. The present invention may implement either or both signal processing and/or control circuits, which are generally identified in FIG. 5G at 1604, a WLAN interface and/or mass data storage of the media player 1600. In some implementations, media player 1600 includes a display 1607 and/or a user input 1608 such as a keypad, touchpad and the like. In some implementations, media player 1600 may employ a graphical user interface (GUI) that typically employs menus, drop down menus, icons and/or a point-and-click interface via display 1607 and/or user input 1608. Media player 1600 further includes an audio output 1609 such as a speaker and/or audio output jack. Signal processing and/or control circuits 1604 and/or other circuits (not shown) of media player 1600 may process data, perform coding and/or encryption, perform calculations, format data and/or perform any other media player function.

Media player 1600 may communicate with mass data storage 1610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices, for example, hard disk drives and/or DVD drives. At least one HDD may have the configuration shown in FIG. 5A and/or at least one DVD drive may have the configuration shown in FIG. 5B. The HDD may be a mini HDD that includes one or more platters having a diameter that is smaller than approximately 1.8". Media player 1600 may be connected to memory 1614 such as RAM, ROM, low latency nonvolatile memory such as flash memory and/or other suitable electronic data storage. Media player 1600 also may support connections with a WLAN via a WLAN interface 1616. Still other implementations in addition to those described above are contemplated.

Figure 5H:
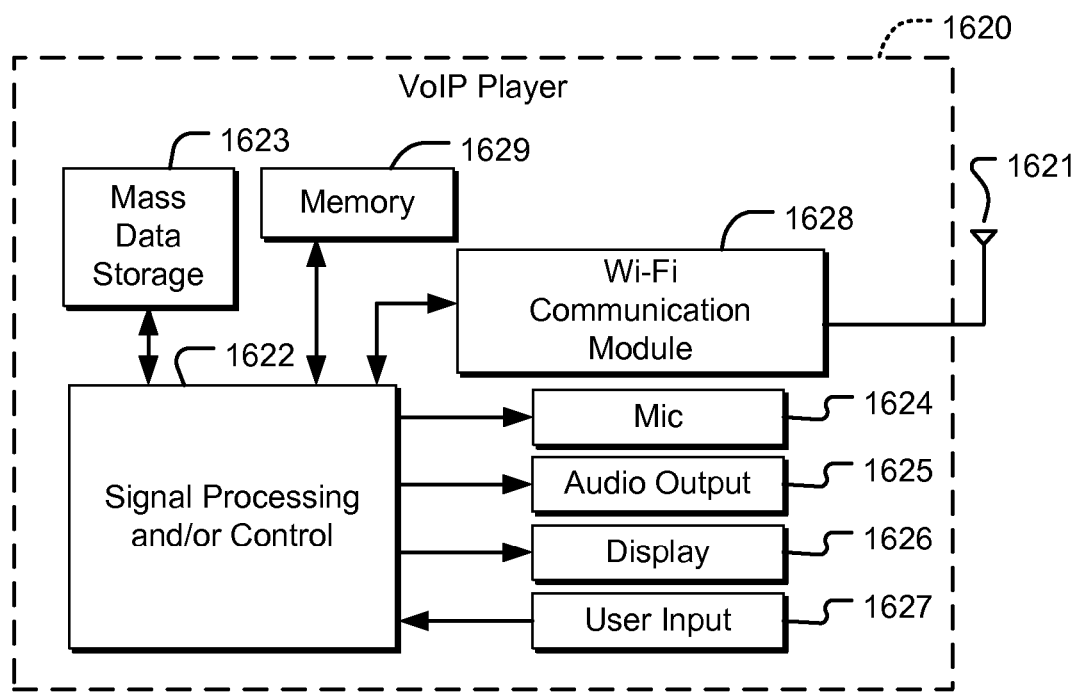
FIG. 5H is a block diagram of an embodiment of the invention in a Voice-over Internet Protocol (VoIP) player.

Referring to FIG. 5H, the present invention may be embodied as a packaged semiconductor in a Voice over Internet Protocol (VoIP) player 1620 that may include an antenna 1621. The present invention may implement either or both signal processing and/or control circuits, which are generally identified in FIG. 5H at 1622, a wireless interface and/or mass data storage of the VoIP player 1620. In some implementations, VoIP player 1620 includes, in part, a microphone 1624, an audio output 1625 such as a speaker and/or audio output jack, a display monitor 1626, an input device 1627 such as a keypad, pointing device, voice actuation and/or other input devices, and a Wireless Fidelity (Wi-Fi) communication module 1628. Signal processing and/or control circuits 1622 and/or other circuits (not shown) in VoIP player 1620 may process data, perform coding and/or encryption, perform calculations, format data and/or perform other VoIP player functions.

VoIP player 1620 may communicate with mass data storage 1623 that stores data in a nonvolatile manner such as optical and/or magnetic storage devices, for example hard disk drives and/or DVD drives. At least one HDD may have the configuration shown in FIG. 5A and/or at least one DVD drive may have the configuration shown in FIG. 5B. The HDD may be a mini HDD that includes one or more platters having a diameter that is smaller than approximately 1.8". VoIP player 1620 may be connected to memory 1629, which may be a RAM, ROM, low latency nonvolatile memory such as flash memory and/or other suitable electronic data storage. VoIP player 1620 is configured to establish communications link with a VoIP network (not shown) via Wi-Fi communication module 1628.

The invention has been described above with respect to particular illustrative embodiments. It is understood that the invention is not limited to the above-described embodiments and that various changes and modifications may be made without departing from the scope of the invention.

What is claimed is:

1. A semiconductor package comprising:
    a die pad;
    an interposer mounted on the die pad, the interposer having a ground connection and a power connection;
    a first semiconductor die mounted on the die pad, wherein the first semiconductor die is positioned side-by-side to the interposer;
    a second semiconductor die mounted on the interposer;
    wiring that directly couples the first semiconductor die to (i) bond fingers, (ii) the ground connection, and (ii) the power connection; and
    wiring that directly couples the second semiconductor die to (i) bond fingers, (ii) the ground connection, and (iii) the power connection.

2. The semiconductor package of claim 1, further comprising:
    a third semiconductor die mounted on the first semiconductor die.

3. The semiconductor package of claim 2, further comprising:
    wiring that directly couples the third semiconductor die to (i) bond fingers and (ii) the first semiconductor die.

4. The semiconductor package of claim 2, further comprising:
    a fourth semiconductor die mounted on the second semiconductor die.

5. The semiconductor package of claim 4, further comprising:
    wiring that directly couples the fourth semiconductor die to (i) bond fingers and (ii) the second semiconductor die,
    wherein the wiring that directly couples the fourth semiconductor die to the second semiconductor die is further electrically coupled to (i) the ground connection, and (ii) the power connection through the wiring that directly couples the second semiconductor die to the ground connection and the power connection.

6. The semiconductor package of claim 1, wherein the ground connection and the power connection are disposed between (i) the first semiconductor die and (ii) the second semiconductor die.

7. The semiconductor package of claim 1, wherein:
    the ground connection is a first ground connection and the power connection is a first power connection, the interposer further comprising (i) a second ground connection and (ii) a second power connection;
    the second ground connection is wire bonded to an electrical ground;
    the second power connection is wire bonded to bond fingers;
    the first ground connection is electrically coupled to the second ground connection to provide indirect access to the electrical ground for the first semiconductor die and the second semiconductor die; and
    the first power connection is electrically coupled to the second power connection to provide indirect access to bond fingers for the first semiconductor die and the second semiconductor die.

8. The semiconductor package of claim 7, wherein:
the first ground connection is routed inside the interposer to the second ground connection; and
the first power connection is routed inside the interposer to the second power connection.

9. The semiconductor package of claim 7, wherein:
the first ground connection and the first power connection are disposed between respective inner, opposing edges of the first semiconductor die and the second semiconductor die; and
the second ground connection and the second power connection are disposed along an edge of the interposer that is substantially perpendicular to the inner, opposing edges of the first semiconductor die and the second semiconductor die.

10. The semiconductor package of claim 7, wherein the electrical ground comprises a ring-shaped structure that surrounds the first semiconductor die and the interposer.

11. The semiconductor package of claim 1, wherein the interposer functions as a capacitor or an inductor.

12. The semiconductor package of claim 1, wherein the interposer comprises at least one of (i) a ball-grid array (BGA) substrate material and (ii) a silicon die.

13. The semiconductor package of claim 1, wherein the die pad is exposed to provide thermal regulation.

14. The semiconductor package of claim 1, further comprising:
wiring that directly couples the first semiconductor die to the second semiconductor die.

15. The semiconductor package of claim 4, wherein:
the first semiconductor die comprises an application specific integrated circuit (ASIC);
the second semiconductor die comprises random access memory;
the third semiconductor die comprises flash memory; and
the fourth semiconductor die comprises another random access memory.

* * * * *